(12) United States Patent
Park

(10) Patent No.: US 8,742,551 B2
(45) Date of Patent: Jun. 3, 2014

(54) SEMICONDUCTOR PACKAGE AND METHOD OF MANUFACTURING THE SAME

(71) Applicant: STS Semiconductor & Telecommunications Co., Ltd., Chungcheongnam-do (KR)

(72) Inventor: Min Suh Park, Chungcheongnam-do (KR)

(73) Assignee: STS Semiconductor & Telecommunications Co., Ltd, Chungcheongnam-do (KR)

( * ) Notice: Subject to any disclaimer, the term of this patent is extended or adjusted under 35 U.S.C. 154(b) by 0 days.

(21) Appl. No.: 13/716,652

(22) Filed: Dec. 17, 2012

(65) Prior Publication Data

US 2013/0285222 A1 Oct. 31, 2013

(30) Foreign Application Priority Data

Apr. 26, 2012 (KR) ........................ 10-2012-0043894

(51) Int. Cl.
*H01L 23/495* (2006.01)
(52) U.S. Cl.
USPC ........................... 257/666; 257/676; 257/787
(58) Field of Classification Search
USPC ................................ 257/666, 676, 701, 784
See application file for complete search history.

(56) References Cited

U.S. PATENT DOCUMENTS

| 6,884,652 B2 * | 4/2005 | Huang et al. .................. 438/106 |
| 7,687,893 B2 * | 3/2010 | Smith ............................ 257/676 |
| 7,993,967 B2 * | 8/2011 | Jiang et al. ..................... 438/106 |
| 8,426,254 B2 * | 4/2013 | Tan et al. ....................... 438/123 |
| 8,513,680 B2 * | 8/2013 | Kim et al. ....................... 257/79 |

FOREIGN PATENT DOCUMENTS

| KR | 10-2008-0080884 | 11/2008 |
| KR | 10-2012-0034529 | 4/2012 |

OTHER PUBLICATIONS

Korean Patent Application No. 10-2012-0043894 Office Action dated Jul. 12, 2013.

* cited by examiner

*Primary Examiner* — S. V. Clark
(74) *Attorney, Agent, or Firm* — Kilpatrick Townsend & Stockton LLP

(57) ABSTRACT

A semiconductor package including: a lead frame including a chip attachment unit and a lead unit; a semiconductor chip that is mounted on the chip attachment unit of the lead frame; a wire that electrically connects the semiconductor chip to the lead unit; an insulation layer formed in the lead frame under the chip attachment unit; and an encapsulant that seals an upper portion of the lead frame, the semiconductor chip, and the wire, wherein the lead unit does not protrude to the outside of the encapsulant.

2 Claims, 4 Drawing Sheets

SEMICONDUCTOR PACKAGE AND METHOD OF MANUFACTURING THE SAME

CROSS-REFERENCE TO RELATED PATENT APPLICATION

This application claims the benefit of Korean Patent Application No. 10-2012-0043894, filed on Apr. 26, 2012, in the Korean Intellectual Property Office, the disclosure of which is incorporated herein in its entirety by reference.

BACKGROUND OF THE INVENTION

1. Field of the Invention

The present invention relates to a semiconductor package and a method of manufacturing the semiconductor package, and more particularly, to a semiconductor package, which has excellent insulation characteristics with respect to the outside and a low manufacturing cost and is favorable for high integration and miniaturization, and a method of manufacturing the semiconductor package 2. Description of the Related Art The sizes of electronic products have been continuously decreased, and electronic products require more and more high capacity data processing. Accordingly, miniaturization and high integration of semiconductor packages that are used in the electronic products is required. In addition, functions of the semiconductor packages become complicated as functions of the electronic produces become complex, and thus, high integration of the semiconductor packages are required and furthermore, the semiconductor packages have to have excellent insulation characteristics with respect to the outside.

SUMMARY OF THE INVENTION

The present invention provides a semiconductor package that has excellent insulation characteristics with respect to the outside and is favorable for high integration and miniaturization.

The present invention also provides a method of manufacturing a semiconductor package that has a low manufacturing cost and excellent insulation characteristics with respect to the outside and is favorable for high integration and miniaturization.

According to an aspect of the present invention, there is provided a semiconductor package including: a lead frame including a chip attachment unit and a lead unit; a semiconductor chip that is mounted on the chip attachment unit of the lead frame; a wire that electrically connects the semiconductor chip to the lead unit; an insulation layer formed in the lead frame under the chip attachment unit; and an encapsulant that seals an upper portion of the lead frame, the semiconductor chip, and the wire, wherein the lead unit does not protrude to the outside of the encapsulant.

The encapsulant may be formed to completely cover the lead unit of the lead frame, and one of the side walls of the lead unit and encapsulant may have the same vertical plane.

The semiconductor package may further include an opening formed between the chip attachment unit and the lead unit.

The semiconductor package may further include a second insulation layer formed in a portion under the lead unit.

An upper surface of the lead unit may be an inner connection lead that is connected to the semiconductor chip, and a lower surface of the lead unit may be an outer connection lead that is connected to an external apparatus.

The semiconductor package may be a Quad Flat No-lead (QFN) package or a Micro Lead Frame (MLF) package.

According to another aspect of the present invention, there is provided a method of manufacturing a semiconductor package, the method including: manufacturing a lead frame in which a chip attachment unit and a lead unit are spaced apart from the chip attachment unit; mounting a semiconductor chip on the chip attachment unit of the lead frame; connecting the semiconductor chip to the lead unit by using a wire; sealing an upper portion of the lead frame, the semiconductor chip, and the wire by using an encapsulant such that the lead unit does not protrude to the outside of the encapsulant, and forming an insulation layer in the lead frame under the chip attachment unit.

The manufacturing of the lead frame may include: disposing a base substrate; and processing the base substrate by using a stamping method.

The forming of the insulation layer may include: forming a recess by selectively etching the lead frame under the chip attachment unit; and forming the insulation layer in the recess.

The method may further include forming a second insulation layer in a portion of the lead frame under the lead unit.

Since a lead frame that is used in a semiconductor package according to an exemplary embodiment of the present invention is manufactured by processing a base substrate through a stamping method, it is possible to reduce a manufacturing cost compared to when manufacturing the lead frame by using an etching method.

In the semiconductor package according to the exemplary embodiment, a lead unit may be formed to not protrude to the outside of an encapsulant. One of the side walls of the lead unit and encapsulant of the semiconductor package may have the same vertical plane. Accordingly, the lead unit may be installed inside the semiconductor package, and thus, the semiconductor package is favorable for high integration and its reduced thickness.

In the semiconductor package according to the exemplary embodiment, an insulation layer is formed in the lead frame under a chip attachment unit, thereby improving insulation characteristics with respect to an external apparatus or an external device that is outside of the semiconductor package.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The inventive concept will now be described more fully with reference to the accompanying drawings, in which exemplary embodiments of the inventive concept are shown. The inventive concept may, however, be embodied in many different forms and should not be construed as being limited to the embodiments set forth herein; rather, these embodiments are provided so that this disclosure will be thorough and complete, and will fully convey the concept of the inventive concept to those skilled in the art. However, this is not intended to limit the inventive concept to particular modes of practice, and it is to be appreciated that all changes, equivalents, and substitutes that do not depart from the spirit and technical scope of the inventive concept are encompassed in the inventive concept. In the description of the inventive concept, certain detailed explanations of related art are omitted when it is deemed that they may unnecessarily obscure the essence of the inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless defined differently, all terms used in the description including technical and scientific terms have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

Figure 1:
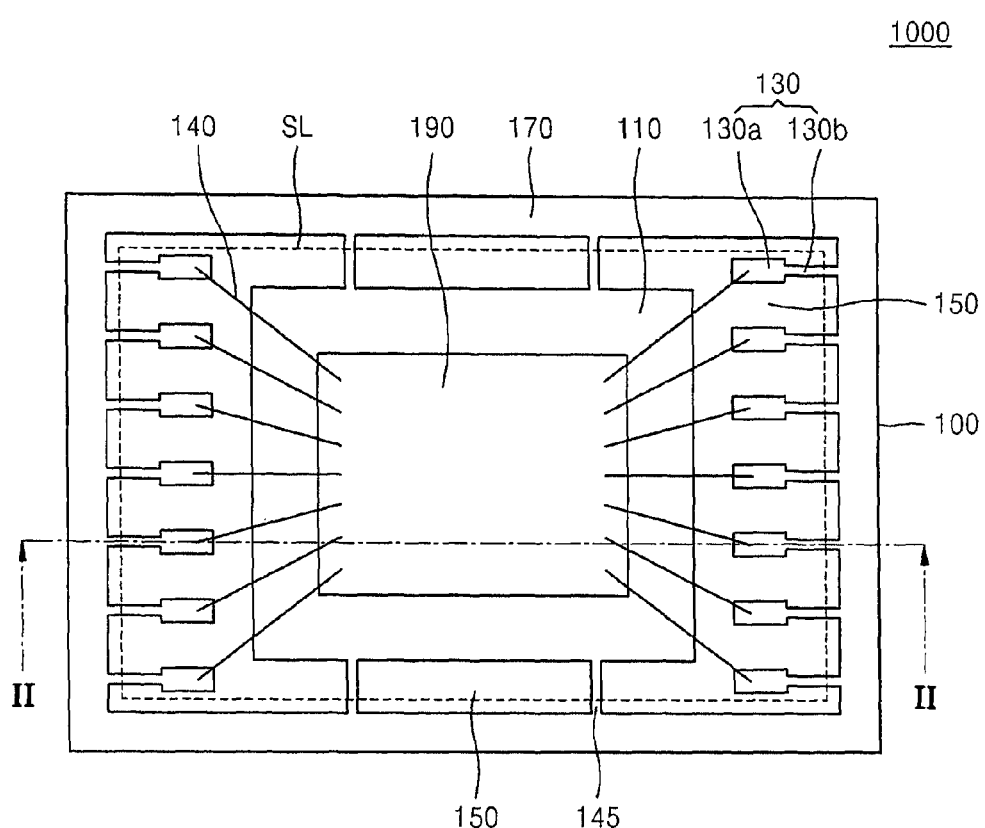
FIG. 1 and FIG. 2 are a plan view and a cross-sectional view, respectively, illustrating a semiconductor package according to an embodiment of the present invention.
Figure 2:
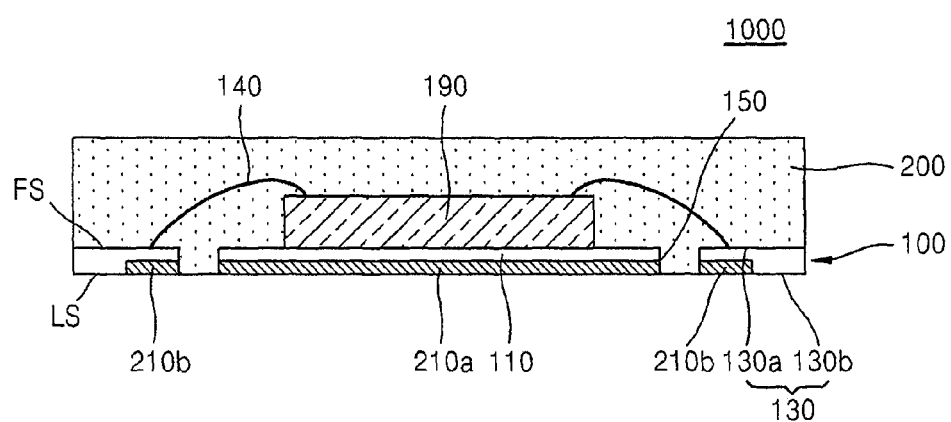

FIG. 1 and FIG. 2 are a plan view and a cross-sectional view, respectively, illustrating a semiconductor package 1000 according to an embodiment of the present invention. In detail, FIG. 2 is a cross-sectional view taken along line II-II of FIG. 1.

Referring to FIG. 1 and FIG. 2, the semiconductor package 1000 includes a lead frame 100 that includes a chip attachment unit 110 and a lead unit 130. The lead frame 100 may be formed of a conductive metal.

An opening 150 may be formed in the lead frame 100, and the chip attachment unit 110 and the lead unit 130 may be distinguished from each other by the opening 150. The opening 150 may be formed between the chip attachment unit 110 and the lead unit 130. The lead unit 130 is spaced apart from the chip attachment unit 110 and may surround the chip attachment unit 110. The lead unit 130 may form one body with a Damber line 170, and the Damber line 170 may be removed during a process of manufacturing the semiconductor package 1000.

A semiconductor chip 190 may be mounted on the chip attachment unit 110 of the lead frame 100. The semiconductor chip 190 and the lead unit 130 may be electrically connected to each other by a wire 140. An upper surface of the lead unit 130 may be an inner connection lead 130a that is connected to the semiconductor chip 190, and a lower surface of the lead unit 130 may be an outer connection lead 130b that is connected to an external apparatus.

The chip attachment unit 110 may be connected to the Damber line 170 by a tie bar 145. The chip attachment unit 110 may be formed in consideration of the size of the semiconductor chip 190 included in the semiconductor package 1000. The chip attachment unit 110 may be formed to have a cross-sectional area larger than the semiconductor chip 190. In FIG. 1, "SL" indicates a cutting line that is used for performing a singulation process to make a single semiconductor package 1000.

A first insulation layer 210a may be formed in the lead frame 100 under the chip attachment unit 110. A second insulation layer 210b may be formed in a portion under the lead unit 130. The first insulation layer 210a and the second insulation layer 210b may be formed to improve insulation characteristics with respect to an external apparatus or an external device that is outside of the semiconductor package 1000.

An encapsulant 200 that seals an upper portion of the lead frame 100, the semiconductor chip 190, and the wire 140 is formed. The encapsulant 200 may be formed to completely cover the lead unit 130 in the lead frame 100.

The semiconductor package 1000 according to the current embodiment of the present invention may be formed such that the lead unit 130 does not protrude to the outside of the encapsulant 200. One of the side walls of the lead unit 130 and encapsulant 200 of the semiconductor package 1000 in which the lead unit 130 does not protrude to the outside of the encapsulant 200 may be a Quad Flat No-lead (QFN) package or a Micro Lead Frame (MLF) package. The lead unit 130 has a lower surface LS and an upper surface FS. Accordingly, the lead unit 130 may be installed inside the semiconductor package 1000, and thus, the semiconductor package 1000 is favorable for high integration and its reduced thickness.

Figure 3:
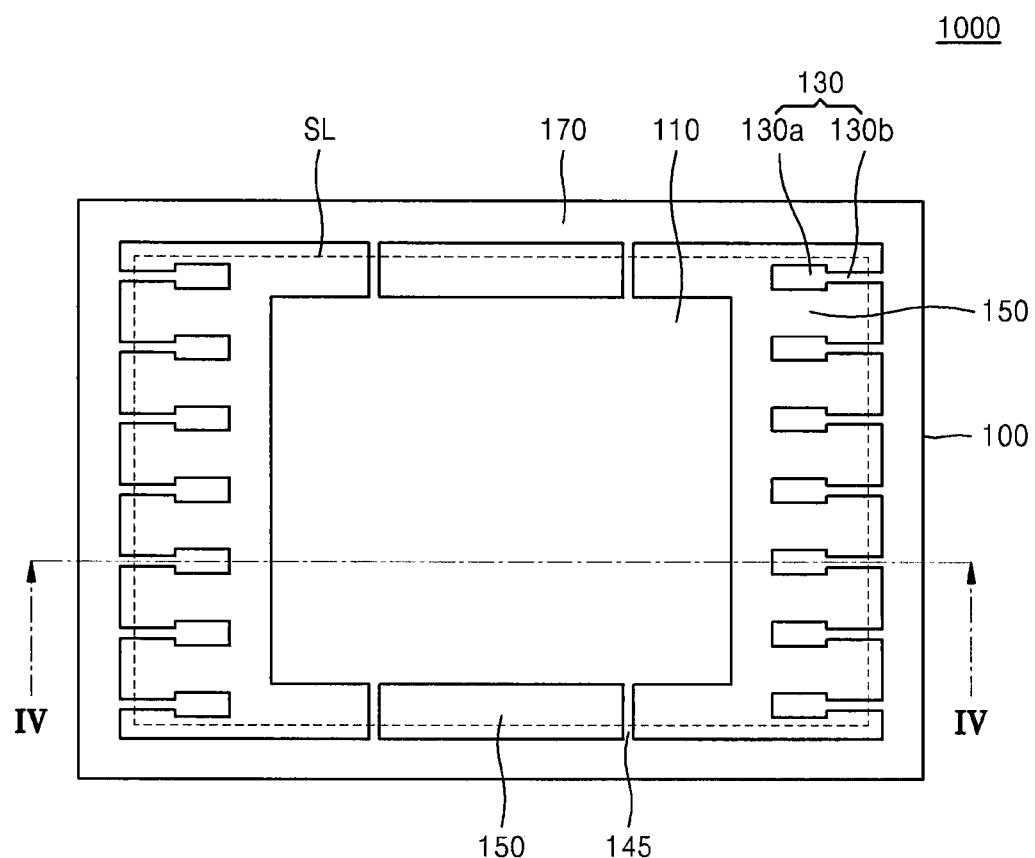
FIG. 3 and FIG. 4 are a plan view and a cross-sectional view, respectively, illustrating a process of manufacturing a lead frame that is used for manufacturing a semiconductor package, according to an embodiment of the present invention.
Figure 4:
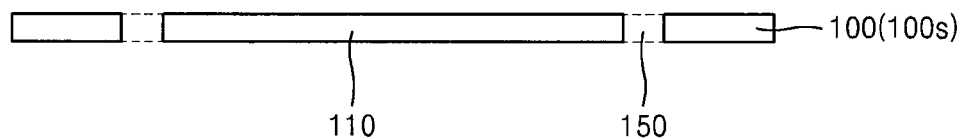

FIG. 3 and FIG. 4 are a plan view and a cross-sectional view, respectively, illustrating a process of manufacturing a lead frame 100 that is used for manufacturing a semiconductor package 1000, according to an embodiment of the present invention. FIG. 4 is a cross-sectional view taken along line IV-IV of FIG. 3.

Referring to FIGS. 3 and 4, a base substrate 100s for the lead frame 100 is disposed, and then the lead frame 100 is manufactured by processing the base substrate 100s through a stamping method. Since the lead frame 100 is manufactured by using the stamping method, it is possible to reduce a manufacturing cost compared to when manufacturing the lead frame 100 by using an etching method.

The lead frame 100 includes a chip attachment unit 110 and a lead unit 130. The lead frame 100 may be formed of a conductive metal. The lead frame 100 may be formed by performing pre-plating on a copperplate, and a layer that is formed by the pre-plating may be formed to have a single layer or multi-layer structure including one selected from the group consisting of nickel (Ni), gold (Au), and silver (Ag).

When manufacturing the lead frame 100 by using the stamping method, an opening 150 may be formed in the lead frame 100. As described above, the chip attachment unit 110 and the lead unit 130 may be distinguished from each other by the opening 150. The opening 150 may be formed between the chip attachment unit 110 and the lead unit 130. The lead unit 130 is spaced apart from the chip attachment unit 110 and may surround the chip attachment unit 110. The lead unit 130 may form one body with a Damber line 170, and the Damber line 170 may be removed during a process of manufacturing the semiconductor package 1000.

An upper portion of the lead unit 130 may be an inner connection lead 130a that is connected to a semiconductor chip during a process of manufacturing the semiconductor package 1000, and a lower portion of the lead unit 130 may be an outer connection lead 130b that is connected to an external apparatus.

The chip attachment unit 110 may be connected to the Damber line 170 by a tie bar 145. The chip attachment unit 110 may be formed in consideration of the size of the semiconductor chip that is included during a process of manufacturing the semiconductor package 1000. The chip attachment unit 110 may be formed to have a cross-sectional area larger than the semiconductor chip. In FIG. 3, "SL" indicates a cutting line that is used for performing a singulation process to make a single semiconductor package during a process of manufacturing the semiconductor package 1000.

Figure 5:
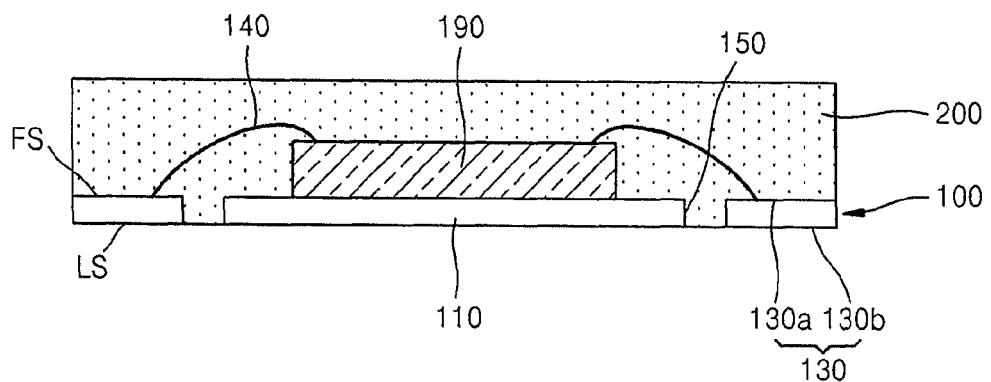
FIG. 5 is a cross-sectional view illustrating a process of mounting a semiconductor chip on a chip attachment unit and molding a resultant structure, according to an embodiment of the present invention.

FIG. 5 is a cross-sectional view illustrating a process of mounting a semiconductor chip 190 on a chip attachment unit 110 and molding a resultant structure, according to an embodiment of the present invention.

Referring to FIG. 5, the semiconductor chip 190 is mounted on the chip attachment unit 110 of the lead frame 100. The semiconductor chip 190 may include a high density semiconductor memory device such as a Dynamic Random Access Memory (DRAM), a Static Random Access Memory (SRAM), a flash memory, etc., a processor such as a Central Processing Unit (CPU), a Digital Signal Processor (DSP), a combination of a CPU and a DSP, etc., or a discrete semiconductor device such as an Application Specific Integrated Circuit (ASIC), a Micro Electro Mechanical System (MEMS) device, an optoelectronic device, etc. The semiconductor chip 190 may be formed by forming a predetermined semiconductor device on a semiconductor wafer (not shown), back-grinding (or back-lapping) the semiconductor wafer, and then separating the predetermined semiconductor device from the semiconductor wafer.

Next, a wire 140 that connects the semiconductor chip 190 to a lead unit 130 of the lead frame 100 is formed to electrically connect the semiconductor chip 190 to the lead frame 100. The wire 140 may be, for example, a gold wire. An upper portion of the lead unit 130 may be an inner connection lead 130a that is connected to the semiconductor chip 190, and a lower portion of the lead unit 130 may be an outer connection lead 130b that is connected to an external apparatus. The wire 140 may include a plurality of wires to connect the semiconductor chip 190 to the lead unit 130.

Next, an encapsulant 200 that seals an upper portion of the lead frame 100, the semiconductor chip 190, and the wire 140 is formed. That is, the encapsulant 200 is formed to completely cover the semiconductor chip 190 and the wire 140. The encapsulant 200 may protect the semiconductor chip 190 and the wire 140 from the outside. The encapsulant 200 may be formed of, for example, an epoxy mold compound (EMC).

Figure 6:
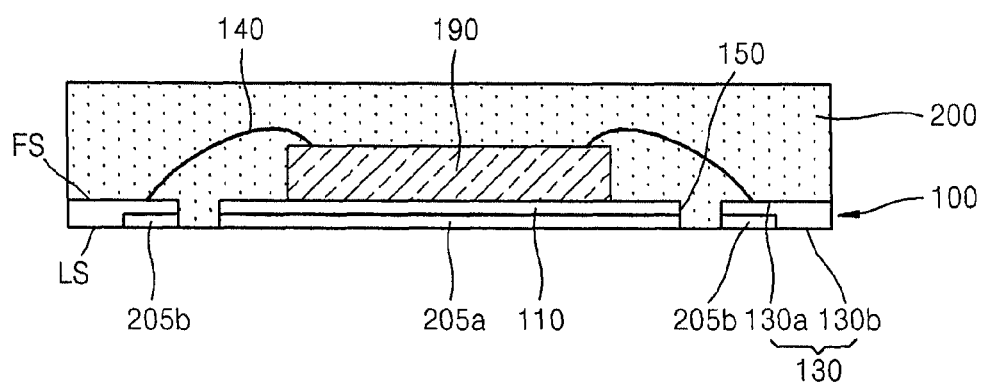
FIG. 6 is a cross-sectional view illustrating a process of forming a recess under a chip attachment unit, according to an embodiment of the present invention.

FIG. 6 is a cross-sectional view illustrating a process of forming a recess under a chip attachment unit 110, according to an embodiment of the present invention.

Referring to FIG. 6, a first recess 205a is formed by selectively etching a lead frame 100 under the chip attachment unit 110. A second recess 205b may also be formed under a lead unit 130 while forming the first recess 205a. The first recess 205a and the second recess 205b may be formed by an etching process.

The first recess 205a and the second recess 205b may be grooves formed by etching the lead frame 100 from the bottom thereof to the inside thereof by a predetermined depth. The depth of the first and second recesses 205a and 205b may be a half of the thickness of the lead frame 100. The reason for forming the first recess 205a and the second recess 205b is to strengthen insulation characteristics with respect to an external apparatus as an insulation layer is formed in a subsequent process.

Figure 7:
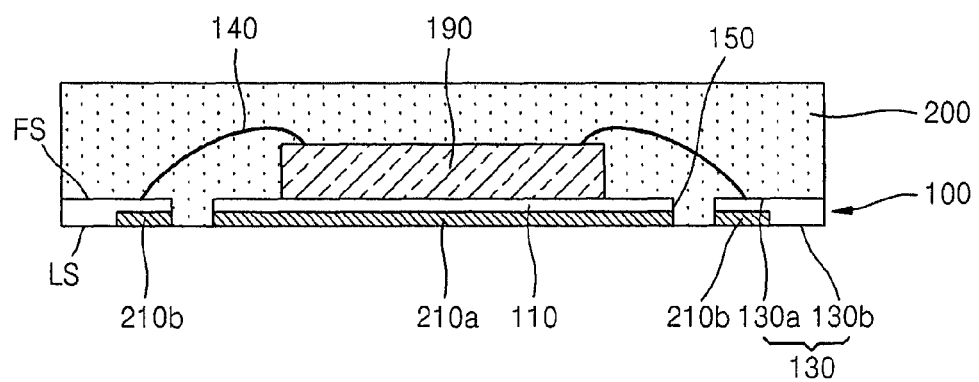
FIG. 7 is a cross-sectional view illustrating a process of forming an insulation layer in a recess under a chip attachment unit, according to an embodiment of the present invention.

FIG. 7 is a cross-sectional view illustrating a process of forming an insulation layer in a recess under a chip attachment unit 110, according to an embodiment of the present invention.

Referring to FIG. 7, a first insulation layer 210a is formed in a first recess 205a formed by selectively etching a lead frame 100 under the chip attachment unit 110. A second insulation layer 210b may be formed in a second recess 205b formed under a lead unit 130 while forming the first insulation layer 210a. The first insulation layer 210a and the second insulation layer 210b may be formed by filling an insulation material in the first and second recesses 210a and 210b or coating an insulation material on the first and second recesses 210a and 210b. Since the first insulation layer 210a and the second insulation layer 210b are formed, the semiconductor package 1000 that is formed by using the above processes according to the embodiments of the present invention may have improved insulation characteristics with respect to an external apparatus.

Next, a singulation process for separating an individual semiconductor package 1000 is performed by removing an encapsulant 200 formed on a Damber line 170 along the cutting line SL of FIG. 1. Each of a plurality of leads units included in the semiconductor package 1000 may be separated from each other through the singulation process. A signal, a power supply voltage, or a ground voltage may be supplied through the lead unit 130.

By using the singulation process, the semiconductor package 1000 may be formed such that the lead unit 130 does not protrude to the outside of the encapsulant 200 toward the outside. Accordingly, as described above, the lead unit 130 may be installed inside the semiconductor package 1000, and thus, the semiconductor package 1000 is favorable for high integration and its reduced thickness.

Figure 8:
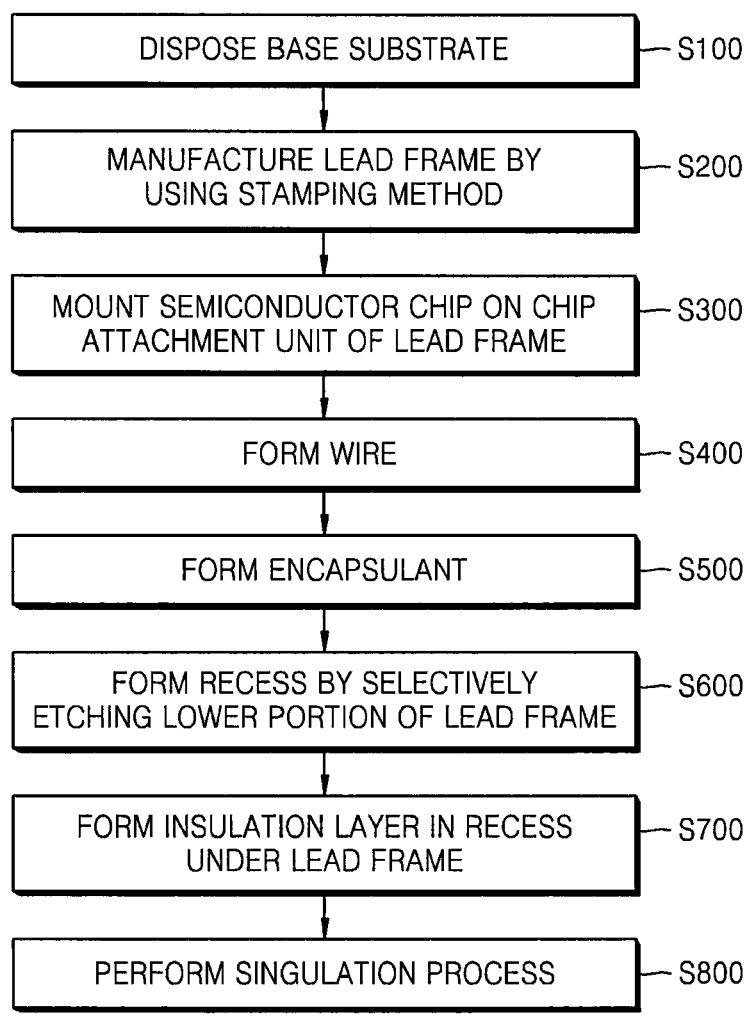
FIG. 8 is a flowchart illustrating a process of forming a semiconductor package, according to an embodiment of the present invention.

FIG. 8 is a flowchart illustrating a process of forming the semiconductor package 1000, according to an embodiment of the present invention.

Referring to FIG. 8 and FIGS. 1 through 7, a base substrate 100s for a lead frame is disposed (operation S100). Then, a lead frame 100 is manufactured by processing the base substrate 100s through a stamping method (operation S200). Since the lead frame 100 is manufactured by using the stamping method, it is possible to reduce a manufacturing cost compared to when manufacturing the lead frame 100 by using an etching method.

A semiconductor chip 190 is mounted on a chip attachment unit 110 of the lead frame 100 (operation S300). Next, a wire 140 is formed to electrically connect the semiconductor chip 190 to a lead unit 130 of the lead frame 100 (operation S400). An upper surface of the lead unit 130 may be electrically connected to the semiconductor chip 190, and a lower surface of the lead unit 130 may be electrically connected to an external apparatus.

Next, an encapsulant 200 that seals an upper portion of the lead frame 100, the semiconductor chip 190, and the wire 140 is formed (operation S500). The encapsulant 200 may be formed of, for example, an epoxy mold compound (EMC).

A first recess 205a is formed by selectively etching the lead frame 100 under the chip attachment unit 110 (operation S600). A second recess 205b may also be formed under the lead unit 130 while forming the first recess 205a. Next, a first insulation layer 210a is formed in the first recess 205a formed by selectively etching the lead frame 100 under the chip attachment unit 110 (operation 700). A second insulation layer 210b may be formed in the second recess 205b formed under the lead unit 130 while forming the first insulation layer 210a.

Subsequently, a singulation process for separating an individual semiconductor package 1000 is performed by removing the encapsulant 200 formed on a Damber line 170 along a cutting line SL of FIG. 1 (operation S800).

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor package comprising:
   a lead frame comprising a chip attachment unit, a lead unit, and an opening formed between the chip attachment unit and the lead unit;
   a semiconductor chip that is mounted on the chip attachment unit of the lead frame;
   a wire that electrically connects the semiconductor chip to the lead unit;
   an insulation layer formed in a recess in the lead frame under the chip attachment unit;
   an encapsulant that seals an upper portion of the lead frame, the semiconductor chip, and the wire; and
   a second insulation layer formed in a portion under the lead unit,
   wherein the lead unit does not protrude to the outside of the encapsulant,
   wherein the encapsulant is formed to completely cover the lead unit of the lead frame, and one of the side walls of the lead unit and encapsulant have the same vertical plane,
   wherein an upper surface of the lead unit is an inner connection lead that is connected to the semiconductor chip, and a lower surface of the lead unit is an outer connection lead that is connected to an external apparatus.

2. The semiconductor package of claim 1, wherein the semiconductor package is a Quad Flat No-lead (QFN) package or a Micro Lead Frame (MLF) package.

* * * * *